(12) United States Patent
Ki

(10) Patent No.: US 6,617,084 B2  
(45) Date of Patent: Sep. 9, 2003

(54) ELECTRON BEAM MASK HAVING DUMMY STRIPE(S) AND LITHOGRAPHIC METHOD OF MANUFACTURING A SEMICONDUCTOR DEVICE USING AN E-BEAM MASK HAVING AT LEAST ONE DEFECTIVE PATTERN

(75) Inventor: Won-tai Ki, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/012,569

(22) Filed: Dec. 12, 2001

(65) Prior Publication Data

US 2002/0086221 A1 Jul. 4, 2002

(30) Foreign Application Priority Data

Dec. 29, 2000 (KR) .......................... 2000-86286

(51) Int. Cl.⁷ .............................. G03F 9/00; G03C 5/00
(52) U.S. Cl. .............................. 430/5; 430/30; 430/296; 430/942
(58) Field of Search .............................. 430/5, 30, 296, 430/942

(56) References Cited

U.S. PATENT DOCUMENTS 6,475,684 B2 * 11/2002 Ki .............................. 430/30

* cited by examiner

Primary Examiner—Christopher G. Young
(74) Attorney, Agent, or Firm—Volentine Francos, PLLC

(57) ABSTRACT

An E-beam mask for use in a lithographic process includes a main pattern of stripes of patterned chrome or tungsten formed on a membrane. The stripes of the main pattern are inspected for defects. Dummy stripes corresponding to a defective stripe of the main pattern are formed on the membrane in spare room outside the region bounded by the main pattern. E-beam exposure processes are then carried out using only the non-defective stripes of the main pattern, and the non-defective dummy stripes instead of a defective stripe of the main pattern once the lithographic process has progressed to the defective stripe of the main pattern. When the lithographic process is being used to manufacture DRAM cells, some of the stripes of the main pattern will have the same chrome or tungsten patterns. As long as all of these similar stripes of the main pattern are not defective, then the E-beam processes can be carried out in a sequence using the non-defective stripes of the main pattern only. However, if all of the similar stripes of the main pattern are determined to be defective, a corresponding dummy stripe is produced on the membrane. In this case, the dummy stripe is used in the lithographic process instead of the similar defective stripes of the main pattern.

27 Claims, 7 Drawing Sheets

ELECTRON BEAM MASK HAVING DUMMY STRIPE(S) AND LITHOGRAPHIC METHOD OF MANUFACTURING A SEMICONDUCTOR DEVICE USING AN E-BEAM MASK HAVING AT LEAST ONE DEFECTIVE PATTERN

BACKGROUND OF THE INVENTION

1. Field of the Invention

The present invention relates to electron beam lithography. More particularly, the present invention relates to an electron beam mask and to a method of manufacturing a semiconductor device using the same.

2. Description of the Related Art

The manufacturing of a semiconductor device requires the controlled implanting of impurities into a small area on a semiconductor substrate. A lithographic process is used for defining this small area. That is, a resist is formed over the entire surface of a wafer. Ultraviolet rays, an electron beam or X-rays are passed through a mask to selectively expose the resist. Subsequently, the exposed resist is developed and patterned, whereby a semiconductor device pattern is formed on the semiconductor substrate.

The photo mask for selectively exposing a resist to ultraviolet rays transfers an image to the entire surface of the wafer in a one-time exposure process. That is, patterns corresponding to a plurality of chips are defined by the photo mask and images of the photo mask patterns are transferred all at once to the wafer, whereby the process is characterized by a high manufacturing yield. However, the resolution and registration are limited to 1 μm and ±3 μm, respectively, due to the diffraction of light passing through the mask.

Meanwhile, lithographic processes must offer higher resolution and registration to meet the demand for more highly integrated semiconductor devices. For this reason, an electron beam (E-beam) lithographic method using a focused E-beam has emerged as the prevailing method of forming dense circuit device patterns. Although electrons have a wave property, the wavelength of an E-beam is extremely short. Thus, a lithographic method using an E-beam is better suited to forming highly-integrated semiconductor circuits than a photo lithographic method using ultraviolet rays.

FIG. 1 is a cross-sectional view of a mask of an E-beam lithographic system. In particular, the mask is used in SCAttering with Angular Limitation in Projection Electron-beam Lithography (SCALPEL) and will thus be referred to hereinafter as a SCALPEL mask. In the SCALPEL mask, a silicon nitride layer and a resist layer are formed on the back surface of a wafer. A membrane 12 made of a silicon nitride layer of about 60 nm is formed on the front surface of the wafer. The silicon nitride layer at the back surface of the wafer is patterned using the resist layer. Supporting bars 10 are formed by etching the back surface of the wafer using the patterned silicon nitride layer. In the meantime, mask patterns 14 made of tungsten or chrome 10 are formed on the membrane 12. If the mask is formed with defects, e.g., if tungsten or chrome patterns are formed where they should not be formed, then such tungsten or chrome patterns are removed using a laser beam. At this time, the laser beam may damage the membrane 12. On the other hand, if tungsten or chrome patterns are not formed where they should, then a deposition process is performed to form the missing tungsten or chrome patterns. This deposition process requires time, and leaves additional defects in the previously formed mask pattern.

Furthermore, current E-beam lithography is performed using an E-beam of 1 mm by 1 mm. Therefore, the images defined by the patterns of the mask can not all be transferred to the surface of the wafer in only one E-beam exposure process.

That is, the E-beam exposure process must be repeated several times for each wafer. Thus, the E-beam lithography is slower than lithography processes using light. In other words, E-beam lithography using an E-beam mask has been characterized as providing a considerably low yield.

SUMMARY OF THE INVENTION

Accordingly, an object of the present invention is to provide an E-beam mask by which E-beam lithography can be carried out to produce semiconductor devices at a considerably higher yield than has heretofore been possible.

Likewise, an object of the present invention is to provide a lithographic method for manufacturing a semiconductor device using an E-beam and which method provides a considerably higher yield than conventional E-beam lithographic processes.

To achieve the above-mentioned first object, the present invention provides an electron beam (E-beam) mask comprising: a membrane, a main pattern including a plurality of stripes formed on the membrane, and a respective non-defective dummy stripe formed in spare room on the membrane in correspondence with each defective stripe in the main pattern. The dummy stripe(s) may be part of at least one dummy pattern each of which includes the same number of dummy stripes as the number of stripes in the main pattern. Alternatively, only dummy stripes corresponding to the defective stripes of the main pattern may be formed on the membrane. Still further, the dummy stripe(s) may be part of a pattern discrete from the main and dummy patterns when the stripe(s) of the dummy pattern(s) corresponding to the defective stripe(s) of the main pattern also has/have a defect.

The E-beam mask may be a SCALPEL mask having stripes that are 1 mm by 12 mm or a Projection Exposure with Variable Axis Immersion Lense (PREVAIL) mask having stripes that are 1 mm by 1 mm. The main and dummy patterns are made of a plurality of chrome or tungsten patterns that are only semi-transparent to the E-beam, and the membrane is made of silicon nitride.

To achieve the second object, the present invention provides lithographic methods of forming a semiconductor device, in which a non-defective dummy stripe is used for each E-beam exposure process instead of a defective stripe of the main pattern.

In a first one of such methods, an E-beam mask is manufactured to include a main pattern comprising a plurality of stripes disposed on a membrane, and a dummy pattern comprising dummy stripes formed in spare room on the membrane outside the region bounded by the main pattern. All of the stripes of the E-beam mask are inspected for defects and information on the defective stripes is stored. The stripes in the E-beam mask are then used in the exposure of a resist. In particular, based on the stored information, the E-beam exposure processes are carried out using the non-defective stripes of the main pattern, and the non-defective stripe(s) of the dummy pattern that correspond to the defective stripe(s) of the main pattern.

However, if the dummy stripe(s) of the dummy pattern(s) corresponding to a defective stripe of the main pattern is/are also found to be defective, an additional dummy stripe is formed in any spare room on the membrane outside the regions bounded by the main and dummy patterns. When the lithographic process reaches the defective stripe of the main pattern, the additional dummy stripe is used for the next E-beam exposure process instead of the defective stripe of the main pattern and the corresponding defective stripe(s) of the dummy pattern(s).

In another method, the main pattern of stripes is formed on the membrane, the stripes of the main pattern are inspected for defects, and then dummy stripes each corresponding to a defective one of the main stripes are formed in spare room on the membrane outside the region bounded by the main pattern. The E-beam exposure processes are carried out in a sequence using the non-defective stripes of the main pattern, and each non-defective dummy stripe corresponding to a respective defective stripe of the main pattern.

The present invention can also be applied to the manufacturing of semiconductor devices wherein the same circuit pattern is to be repeated in several places across the semiconductor substrate, e.g. in DRAM cells.

In particular, a main pattern including a plurality of stripes is formed on a membrane. Some of the stripes have the same internal pattern as is consistent with the nature of manufacturing DRAM cells. The stripes are inspected for defects and information indicative of which of the stripes have the same patterns and which of the stripes have defects is stored. A determination is made as to whether all of the stripes having the same pattern are defective. If so, a dummy stripe corresponding to the defective stripes having the same pattern is formed on the membrane in spare room outside the region bounded by the main pattern.

E-beam exposure processes are then performed based on the stored information. More specifically, the E-beam exposure processes are carried out in a sequence wherein the E-beam is directed through the non-defective stripes of the main pattern. When a defective stripe in the main pattern is reached during the course of said sequence, the E-beam is directed instead through one of the stripes of the main pattern that has the same pattern as the defective stripe as long as that stripe is also non-defective. However, if all of the stripes having the same patterns are defective, the E-beam is instead directed through the corresponding dummy stripe.

In the methods described above, after the E-beam exposure process of is completed, the resist layer is developed, and a semiconductor device pattern is formed on the semiconductor substrate using the developed resist layer.

BRIEF DESCRIPTION OF THE DRAWINGS

The above and other objects, features and advantages of the present invention will become more apparent by referring to the following detailed description of the preferred embodiments thereof made with reference to the attached drawings, of which.

DETAILED DESCRIPTION OF THE PREFERRED EMBODIMENTS

Figure 1:
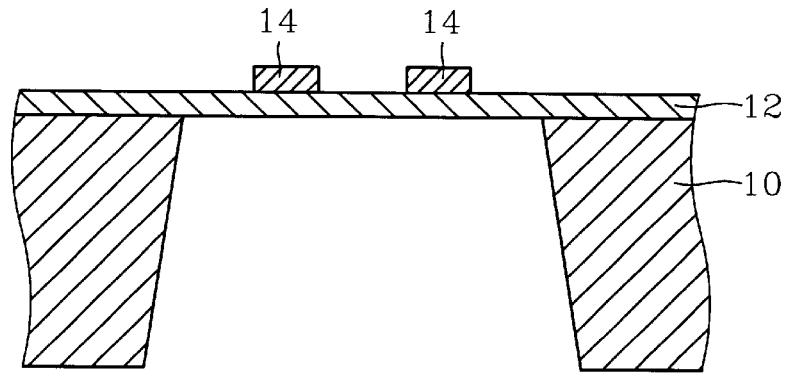
FIG. 1 is a cross-sectional view of a SCALPEL (SCattering with Angular Limitation in Projection Electron-beam Lithography) mask.
Figure 2:
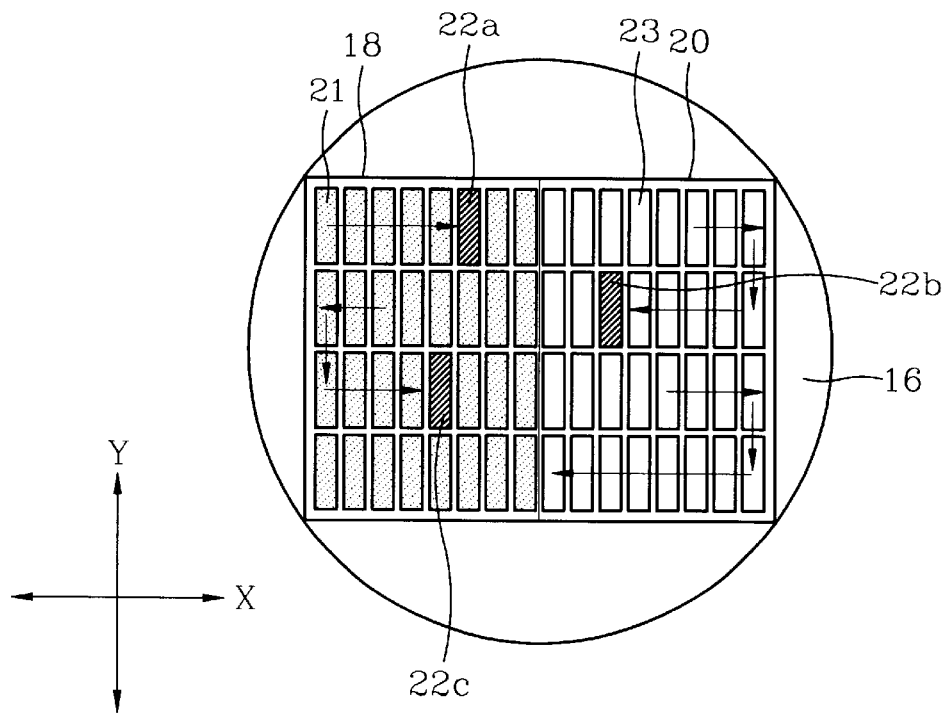
FIG. 2 is a plan view of a first embodiment of an E-beam mask according to the present invention.

FIG. 2 illustrates a first embodiment of a mask used in a SCALPEL E-beam lithography system. The mask comprises a substrate (wafer), and a membrane 16 made of silicon nitride. A main pattern 18 is formed on one side of the membrane 16 (the left side in the figure) and a dummy pattern 20 is formed on the other side of the membrane 16 (the right side in the figure). The main pattern 18, which corresponds to a semiconductor device pattern to be formed, i.e., all of the areas of a resist that are to be exposed, comprises a plurality of stripes 21. Each stripe is made up of a plurality of chrome or tungsten patterns (14 of FIG. 1). The dummy pattern 20 has the same size as the main pattern 18, and the dummy pattern 20 includes the same number of stripes as the main pattern 18. A plurality of the same tungsten or chrome patterns also make up the respective stripes 23. Thus, the stripes 23 of the dummy pattern 20 have a 1:1 correspondence with the respective stripes 21 of the main pattern 18. For example, the third stripe from the left (positive direction of the X-axis) in the first row of stripes of the dummy pattern 20 corresponds to the third stripe from the left (positive direction of the X-axis) of in the first row of stripes of the main pattern 18.

The defective stripes 22a, 22b, and 22c of the main and dummy patterns 18 and 20 are shown as cross-hatched with diagonal lines. The arrows in the figure show the progression of the lithographic process of irradiating the resist, namely, the E-beam exposure processes.

Figure 3:
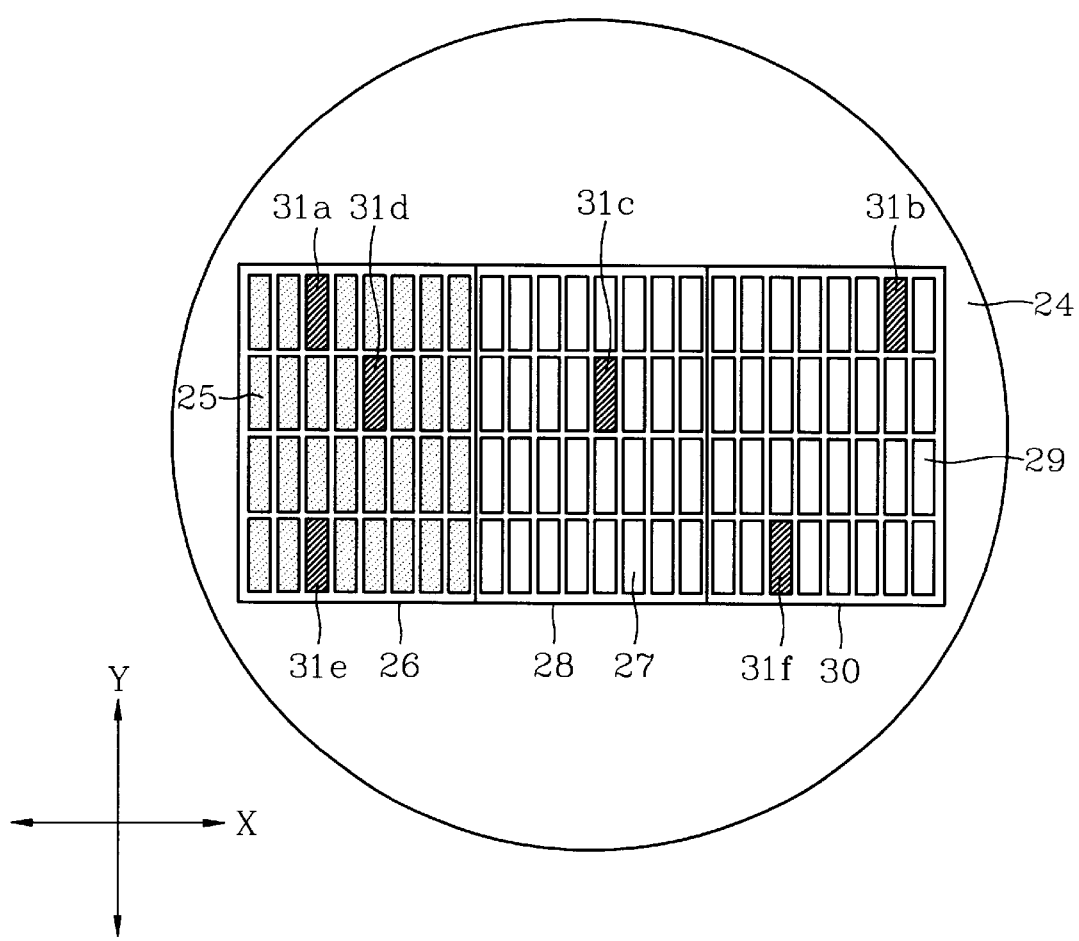
FIG. 3 is a plan view of a second embodiment of an E-beam mask according to the present invention.

FIG. 3 shows a second embodiment of a mask used in a SCALPEL system. With reference to FIG. 3, a main pattern 26 and two dummy patterns 28 and 30 are formed on a membrane 24 made of silicon nitride. The first and second dummy patterns 28 and 30 each have the same size as the main pattern 26, and the first and second dummy patterns 28 and 30 each have the same number of stripes as the main pattern 26. Each of the stripes 25, 27, and 29 of the main pattern 26, the first dummy pattern 28, and the second dummy pattern 30 comprises a plurality of tungsten or chrome patterns.

In the figure, defective stripes 31a, 31d, and 31e of the main pattern 26 and defective stripes 31b, 31c, and 31f of the two dummy patterns 28 and 30 are shown as cross-hatched with diagonal lines. The arrows show the progression of the E-beam exposure processes.

Figure 4:
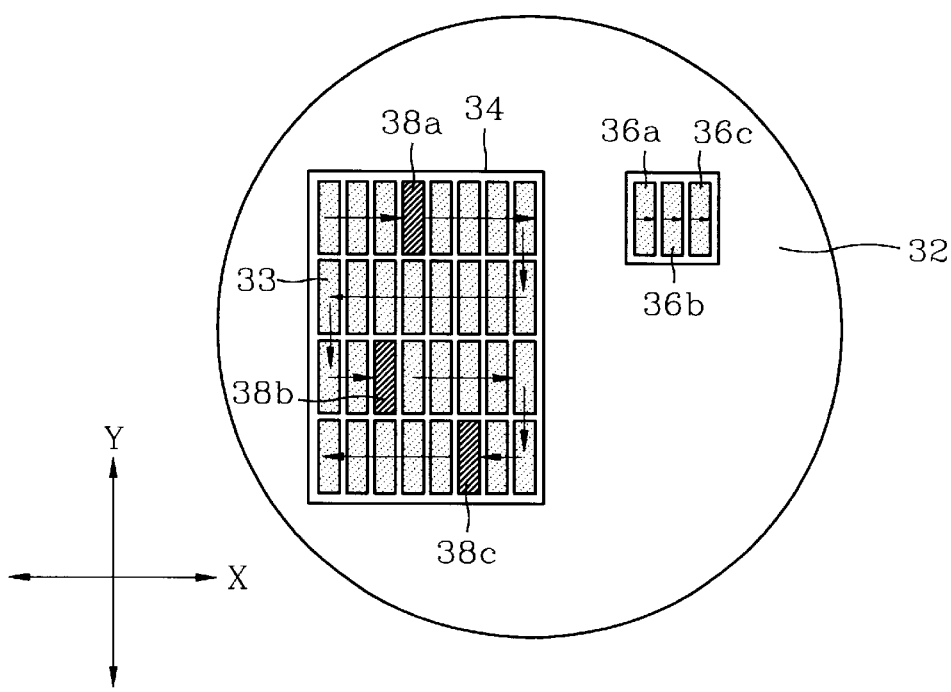
FIG. 4 is a plan view of a third embodiment of an E-beam mask according to the present invention.

FIG. 4 illustrates a third embodiment of an E-beam mask used in a SCALPEL system. Referring to FIG. 4, a main pattern 34 and dummy stripes 36a, 36b, and 36c corresponding to the defective stripes 38a, 38b, and 38c of the main pattern 34 are formed on a membrane 32 made of silicon nitride. In this embodiment, the only dummy stripes 36a, 36b, and 36c formed are those corresponding to the defective stripes 38a, 38b, and 38c of the main pattern 34. This embodiment is particularly useful when there is not enough spare room on the membrane 32 for a dummy pattern of the same size as the main pattern 34. Similar to the previous embodiments, the respective dummy stripes 36a, 36b, and 36c are made up of a plurality of tungsten or chrome patterns. Again, the defective stripes 38a, 38b, and 38c of the main pattern 34 are shown as cross-hatched with diagonal lines, and the arrows show the progression of the E-beam lithographic process, i.e., the E-beam exposure processes.

Figure 5:
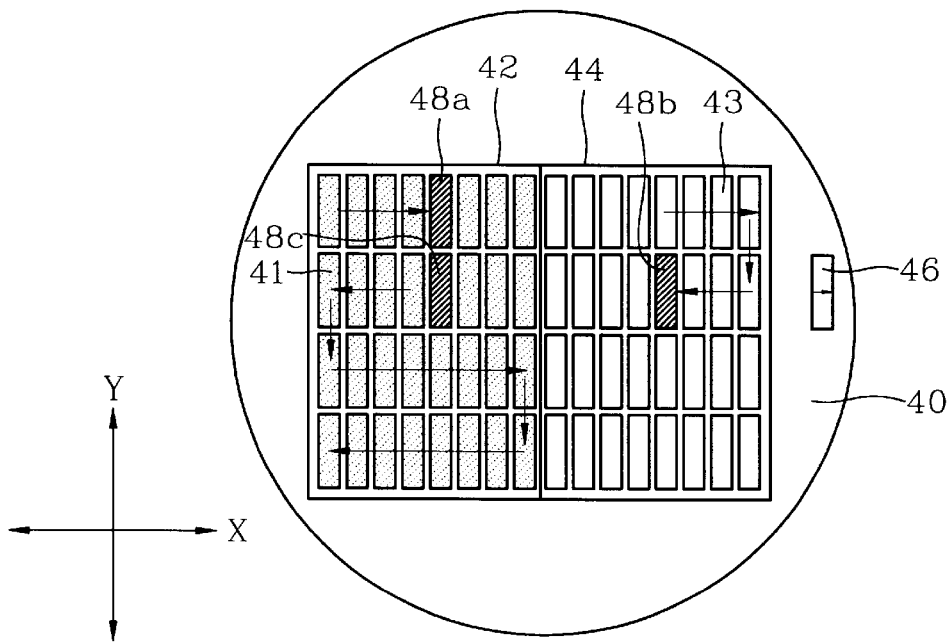
FIG. 5 is a plan view of a fourth embodiment of an E-beam mask according to the present invention.

FIG. 5 illustrates a fourth embodiment of an E-beam mask used in a SCALPEL system. With reference to FIG. 5, a main pattern 42 and a dummy pattern 44 are formed on a membrane 40 made of silicon nitride. The dummy pattern 44 comprises stripes 43 of the same size and number as the stripes of the main pattern 42. However, in this embodiment, when the stripe 48b of the dummy pattern 44 corresponding to the defective stripe 48c of the main pattern 42 also has a defect, the E-beam mask comprises a dummy stripe 46 as a substitute for both of the defective stripes 48b and 48c. The dummy stripe 46 is made up of tungsten or chrome patterns. The embodiment of FIG. 5 is used when the membrane does not have enough spare room to form two dummy patterns as in the embodiment of FIG. 3.

Each embodiment shown in FIGS. 2 through 5 is a SCALPEL mask having 1 mm by 12 mm stripes. However, the present invention can be applied to all E-beam masks having spare room on a membrane on which a main pattern is formed. For example, the present invention can be applied to Projection Exposure with Variable Axis Immersion Lens (PREVAIL) masks having 1 mm by 1 mm stripes.

Figure 6:
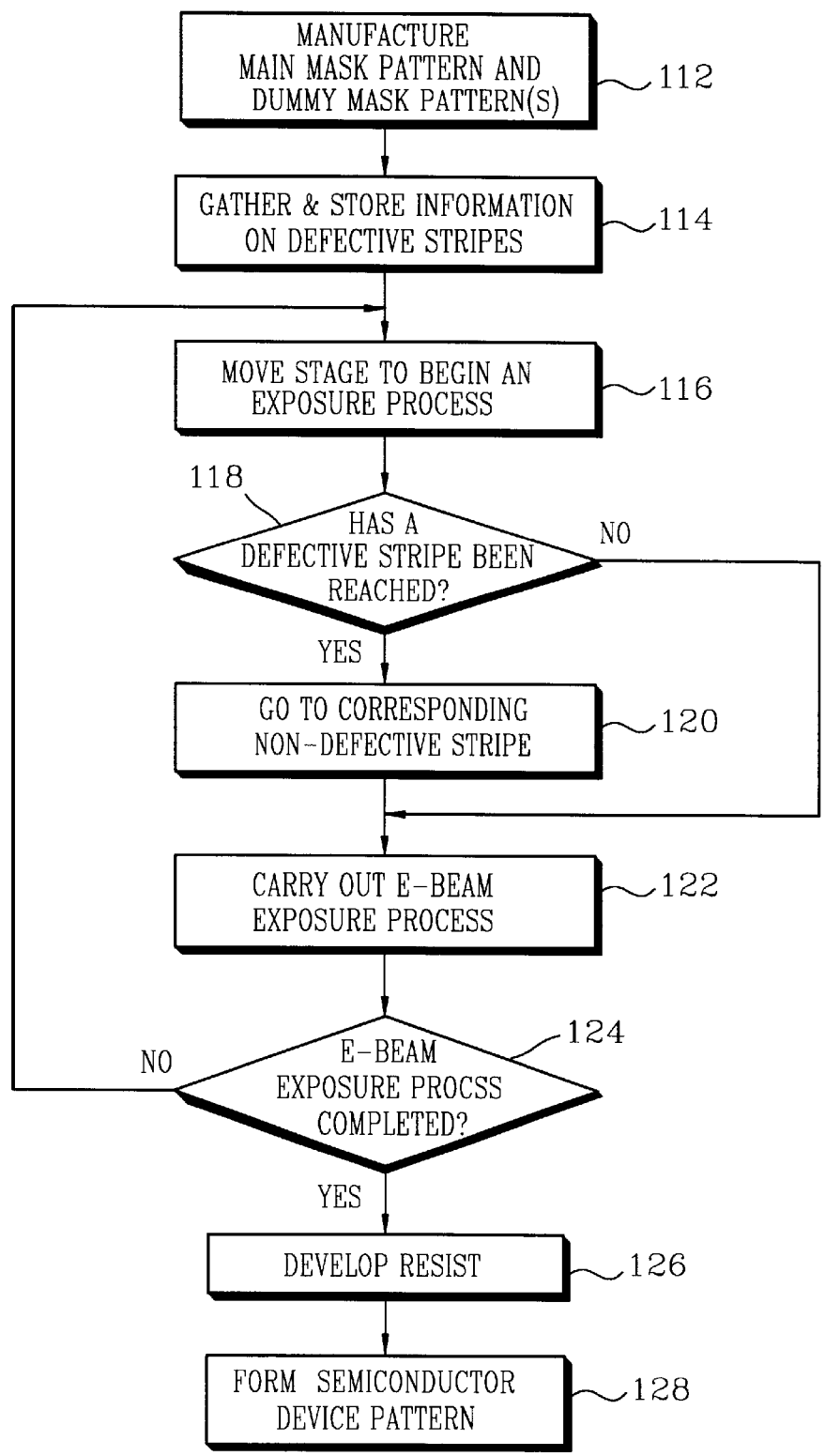
FIG. 6 is a flowchart of a first embodiment of a lithographic method of forming a semiconductor device pattern on a wafer according to the present invention, using the E-beam masks of FIGS. 2 and 3.

Referring now to FIG. 6, a method of forming a semiconductor device pattern on a wafer by selectively exposing a resist layer to an E-beam using the E-beam mask shown in FIG. 2 will be described. First, in step 112, an E-beam mask as shown in FIG. 2 is manufactured. The E-beam mask comprises one main pattern 18 and one dummy pattern 20. In the conventional art, only the main pattern made of stripes of chrome or tungsten patterns is formed on the membrane, and the spare room on the membrane is not used for any particular purpose. However, in the present embodiment, a dummy pattern 20 having the same number of stripes as the main pattern 18 is formed on the otherwise unused space. More specifically, tungsten or chrome is deposited over the entire surface of the membrane 16. Next, the tungsten or chrome is coated with an E-beam resist and the resulting structure is placed in a furnace to bake the resist layer. The photoresist layer is then exposed, developed and patterned. Then a plurality of tungsten or chrome patterns are formed using the patterned resist layer as a mask. Thus, a mask is made comprising a plurality of stripes of tungsten or chrome patterns formed on a transparent membrane 16.

In step 114, a determination is made as to whether any of the stripes 21 and 23 of the main pattern 18 and dummy pattern 20 have defects, and information indicative of the number and positions of any such defective stripes is stored in a computer memory device. In this step, the mask is inspected for defects by mounting the mask on a stage, moving the mask stage under the direction of a controller in which the memory device is incorporated, and scanning the mask with an optical system also connected to the controller.

In the embodiment shown in FIG. 2, for example, in step 114, the scanning of the mask determines that the sixth stripe 22a from the left (in the positive direction of the X-axis) in the first row and the fifth stripe 22c from the left (in the positive direction of the X-axis) in the third row of stripes 21 of the main pattern 18, and the sixth stripe 22b from the right (in the negative direction of the X axis) in the second row of stripes 23 of the dummy pattern 20 have defects. The locations of these defective stripes 22a, 22b and 22c are stored in the computer memory device.

In step 116, an E-beam exposure process is begun on an area of the resist using the E-beam mask. An E-beam is created from a thermionic source, such as a tungsten source or a field-emission source for forming a fine Gaussian spot. The E-beam propagates to the E-beam mask via an electron column that includes various lenses and beam blankers. In this example, an E-beam having a 1 mm by 1 mm spot is used. An electron gun from which the E-beam is generated remains fixed while a mask stage on which the E-beam mask is supported and a wafer stage on which the wafer is supported are moved in the positive direction along the X-axis. The wafer stage moves at a constant speed during an E-beam exposure process.

The E-beam exposure processes are performed using the stripes of the main pattern 18 one after the other by moving the mask stage in predetermined increments corresponding to the spacing between the stripes.

Referring again to FIG. 2, the exposure apparatus, however, recognizes that the sixth stripe 22a from the left in the first row of stripes of the main pattern 18 has defects. Consequently, the E-beam exposure processes are performed up to the stripe just before the defective stripe 22a, namely, up to the fifth stripe from the left in the first row of stripes of the main pattern 18.

In step 118, the controller receives the information from the memory device that the E-beam exposure process has progressed to the defective stripe. In step 120, the controller moves the mask stage in the positive direction along the X-axis all the way to the stripe (sixth stripe in the first row of stripes) of the dummy pattern 20, i.e., to the stripe in the dummy pattern corresponding to the defective stripe. At the same time, the controller moves the wafer stage so that the area of the resist that would have otherwise received the image of the chrome or tungsten pattern of the defective stripe of the main pattern is exposed to the chrome or tungsten pattern of the corresponding stripe of the dummy pattern 20.

In step 122, the mask stage is subsequently moved in the positive direction of the X-axis to continue the E-beam exposure processes using the remaining stripes in the first row of stripes of the dummy pattern 20. Steps 116 through 124 are repeated until the E-beam exposure processes have been completed. That is, the first stripe from the right in the second row of stripes of the dummy pattern is used by moving the mask stage in the negative direction of the Y-axis. Then, the mask stage is moved in the negative direction of the X-axis to continue the E-beam exposure processes using the stripes in the second row (step 122). The sixth stripe 22b from the right in the second row of stripes of the dummy pattern 20 is recalled as being defective (step 118) and thus, the mask stage is moved by the controller in the negative direction of the X-axis to cause the sixth stripe from the right in the second row of stripes of the main pattern 18 to be irradiated immediately after the defective stripe in the second row of stripes of the dummy pattern 20 has been reached (step 120).

After the E-beam exposure processes have been completed using the stripes in the second row (steps 122 and 124), the mask stage moves in the negative direction of the Y-axis to begin irradiating the third row of stripes of the main pattern 18 (steps 124 and 116). The E-beam exposure processes using the third row of stripes are similar to those in which the first row of stripes were used. However, none of the stripes in the fourth row of stripes the dummy pattern have defects and thus, the process is completed in the dummy pattern 20.

The resist layer that has been selectively exposed by an E-beam that has passed through the E-beam mask is developed in step 126. The portions of the membrane 16 of the E-beam mask that are covered by the chrome or tungsten have a lower transmissivity with respect to the E-beam than the portions of the membrane 16 that are not covered. Consequently, those portions of the resist exposed by an E-beam that has passed through the chrome or tungsten patterns of the respective stripes have a low exposure density, whereas those portions of the resist layer exposed by an E-beam that has passed between the chrome or tungsten within the pattern thereof have a high exposure density. Accordingly, the images of the stripes are transferred to areas of the resist layer, respectively. After the resist is developed, a semiconductor device pattern is formed in step 128.

As described above, when the main pattern 18 has defective stripes, e.g., stripes 22a and 22c, the E-beam exposure process is performed using the corresponding stripes of the dummy pattern 20 as long as the corresponding stripes are not defective as well. The probability of a stripe in an E-beam mask having a defect is 5% according to the current technique of producing the stripes. In this embodiment in which a main pattern 18 and one dummy pattern 20 are provided, the probability that a stripe in the dummy pattern 20, corresponding to a defective stripe in the main pattern 18, will also be defective is 0.25% (0.05 times 0.05 times 100). In other words, the mask manufacturing yield is 95% when a mask comprising only a main pattern is used, whereas the manufacturing yield is 99.75% when the mask of the present invention comprising the main pattern 18 and one dummy pattern 20 is used.

Next, the steps of manufacturing a semiconductor device using the E-beam mask of FIG. 3 will be described with reference to the flowchart of FIG. 6. First, the E-beam mask is formed in a manner similar to that described with respect to the forming of the E-beam mask of FIG. 2. In step 114, a determination is made as to whether any of the stripes 25, 27 and 29 of the main pattern 26 and dummy patterns 28 and 30 have defects, and information indicative of the number and positions of any such defective stripes is stored in a computer memory device.

E-beam exposure processes are then performed on the first row of stripes of the main pattern 26 by moving the mask stage in the positive direction of the X-axis. The third stripe 31a from the left in the positive direction of the X axis has a defect. Thus, once the process has progressed to the defective stripe 31a, the controller moves the mask stage such that the third stripe from the left (positive direction of the X axis) in the first row of stripes 27 of the first dummy pattern 28 is irradiated with the E-beam rather than the defective stripe 31a (step 120 and 122). Steps 116 through 124 are then repeated—the E-beam processes continue in the first row using the stripes of the first dummy pattern 28 and then next, beginning with the first stripe from the right stripe in the second row of stripes of the first dummy pattern 28. However, both the fourth stripe 31c from the right in the second row of stripes of the first dummy pattern 28 and the fourth stripe 31d from the right in the second row of stripes of the main pattern 26 have defects. Thus, when the lithographic process progresses in the negative direction of the X-axis to the fourth stripe from the right in the second row of stripes of the first dummy pattern 28 (step 118), the controller moves the mask stage to irradiate the corresponding non-defective stripe in the second dummy pattern 30. E-beam exposure processes are then carried out using the remaining stripes in the second row of stripes of the second dummy pattern 30. The E-beam exposure processes are then carried out using the third row of stripes in the second dummy pattern 30 by first moving the mask stage in the negative direction of the Y-axis (step 122). Steps 116 through 124 are again repeated such that the E-beam exposure processes are carried out using the fourth row of stripes of the second dummy pattern 30. Once the process has progressed in the negative direction of the X-axis to the sixth (defective) stripe 31f from the right in the fourth row of stripes of the second dummy pattern 30 (step 118), the controller moves the mask in the negative direction of the X-axis so that the next stripe irradiated by the E-beam is the corresponding (non-defective) stripe in the fourth row of stripes of the first dummy pattern 28 (step 120) because the corresponding stripe 31e in the main pattern 26 is defective. The E-beam exposure processes are then carried out using the remaining stripes in the fourth row of stripes of the first dummy pattern 28 to complete the overall exposure process (step 124). In step 126, the resist is developed and in step 128, a semiconductor device pattern is formed using the developed resist.

As was mentioned above, the probability of a stripe in the mask being defective is 5% using current techniques for manufacturing E-beam masks.

Therefore, the probability that a stripe in the main pattern and both of the corresponding stripes in two other patterns will all be defective is 0.0125% (0.05 times 0.05 times 0.05 times 100). Consequently, whereas the yield using a conventional mask is 95%, the yield using the mask of FIG. 3 is 99.9875%.

Although the embodiments of FIGS. 2 and 3 employ one dummy pattern and two dummy patterns, respectively, the mask of the present invention can employ three or more dummy patterns if enough spare room is present on the membrane. However, preferably only one or two dummy patterns are employed considering all of the related costs and required time in manufacturing the mask and despite the higher yield afforded by a mask having more than two dummy patterns.

Furthermore, in the E-beam exposure processes described using the masks of FIGS. 2 and 3, the processes progress repeatedly, if needed, in order of the positive direction of the X-axis, the negative direction of the Y-axis, the negative direction of the X-axis, and the negative direction of the Y-axis. However, the E-beam exposure processes may be carried out in each row in the main pattern in only the positive direction of the X-axis.

Figure 7:
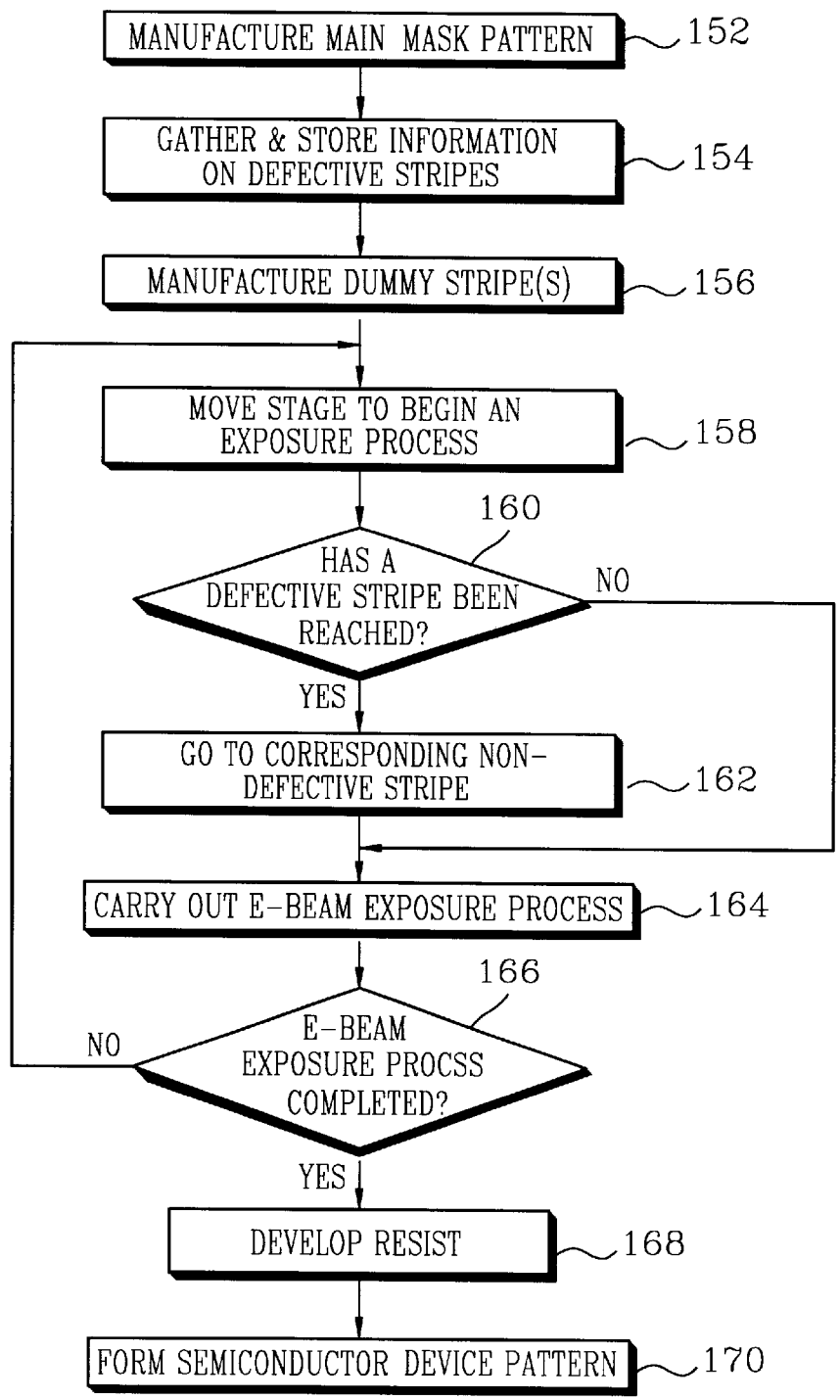
FIG. 7 is a flowchart of a second embodiment of a lithographic method of forming a semiconductor device pattern on a wafer according to the present invention, using the E-beam mask of FIG. 4.

Next, the forming of a semiconductor device on a wafer using the E-beam mask of FIG. 4 will be described with reference to the flowchart of FIG. 7. In step 152, only a main pattern 34 is formed on a membrane 32. Next, a determination is made as to whether any of the stripes of the main pattern have defects, and information indicative of the number and positions of any such defective stripes are stored in a memory device in step 154. For purposes of this example, three defective stripes 38a, 38b, and 38c are found to exist in the main pattern 34. The first defective stripe 38a is at the fourth stripe from the left in the first row of stripes, the second defective stripe 38b is the third stripe from the left in the third row of stripes, and the third defective stripe 38c is the third stripe from the right in the fourth row of stripes.

In step 156, dummy stripes are formed based on the information obtained in step 154. Specifically, three dummy stripes 36a, 36b, and 36c are formed any where there is room on the membrane 32. Although FIG. 4 shows the case in which all three of the dummy stripes 36a, 36b and 36c are formed side-by-side at one location, each dummy stripe(s) may be formed instead to the right or left of the row in which the defective stripe(s) exists, in consideration of the directions in which the mask stage is to be moved. That is, the first, second, third dummy stripes 36a, 36b, and 36c may be respectively formed at the right (or left) of the first row, the right (or left) of the third row, and the right (or left) of the fourth row of stripes of the main pattern 34.

To form the dummy stripe(s), a chrome or tungsten layer is formed where there is spare room on the membrane 32. After the substrate is coated with resist, the area(s) in which the dummy stripe(s) will be formed adjacent the main pattern (to the right, left, above, or below in the figure) is exposed (or shielded). The resist is then developed and the dummy stripes 36a, 36b, and 36c are formed using the developed resist as a mask. Thus, an E-beam mask comprising the main pattern 34 and the dummy stripes 36a, 36b, and 36c is completed.

In steps 158–164, the E-beam exposure processes are carried out. The E-beam exposure processes are begun by moving the mask stage (step 158) in the positive direction of the X axis. In a first series of processes, the E-beam is directed through the stripes in the first row of stripes of the main pattern 34. However, the fourth stripe 38a from the left in the first row of stripes is recalled as having defects in step 160. Thus, the E-beam exposure processes continue until just before the defective stripe 38a is reached, i.e., until the exposure process is performed using the third stripe from the left.

In step 160, the controller determines from the information stored in the memory device that the process has reached a defective stripe. In step 162, therefore, the controller moves the mask stage in the positive direction of the X-axis such that the first dummy stripe 36a will be irradiated next. After the first dummy stripe 36a is irradiated in an E-beam exposure process, the controller moves the mask stage in the negative direction of the X-axis such that the stripes just to the right of the first defective stripe 38a will be irradiated one after the other (step 164). Because all of the E-beam exposure processes have not been completed, steps 158 through 166 are repeated. That is, the mask stage is moved in the negative direction of the Y-axis such that the first stripe from the right in the second row of stripes will be irradiated next. The E-beam exposure processes are carried out using the stripes in the second row by moving the mask stage in predetermined increments in the negative direction of the X-axis. Several E-beam exposure processes are carried out without interruption (steps 158 through 160) because none of the stripes in the second row were determined to be defective in step 154. After the E-beam exposure processes using the stripes in the second row have been completed, the mask stage is moved in the negative direction of the Y-axis such that the first stripe from the left in the third row of stripes in the main pattern 34 is reached (step 158 again).

The E-beam exposure processes are carried out using the stripes in the third row in the same manner as with respect to the stripes in the first row. That is, after the E-beam exposure process is carried out using the second stripe from the left in the third row of stripes of the main pattern 34 (steps 158 and 164), the mask stage is moved such that the second dummy stripe 36b is irradiated (steps 158, 160 and 162). Steps 158, 160 and 164 are repeated wherein the E-beam exposure processes are carried out using the remaining stripes in the third row of the main pattern 34 beginning with the fourth stripe from the left. Steps 158 through 166 are then repeated wherein the E-beam exposure processes are carried out using the stripes in the fourth row in a manner similar to that carried out using the stripes in the second row. However, the third stripe from the right in the fourth row of stripes has a defect. Therefore, the E-beam exposure process is carried out using the third dummy stripe 36c rather than the using the third stripe from the right in the fourth row. Once all of the E-beam exposure processes have been completed (step 166), the resist is developed in step 168. Finally, a semiconductor device pattern is formed using the developed resist in step 170.

Figure 8:
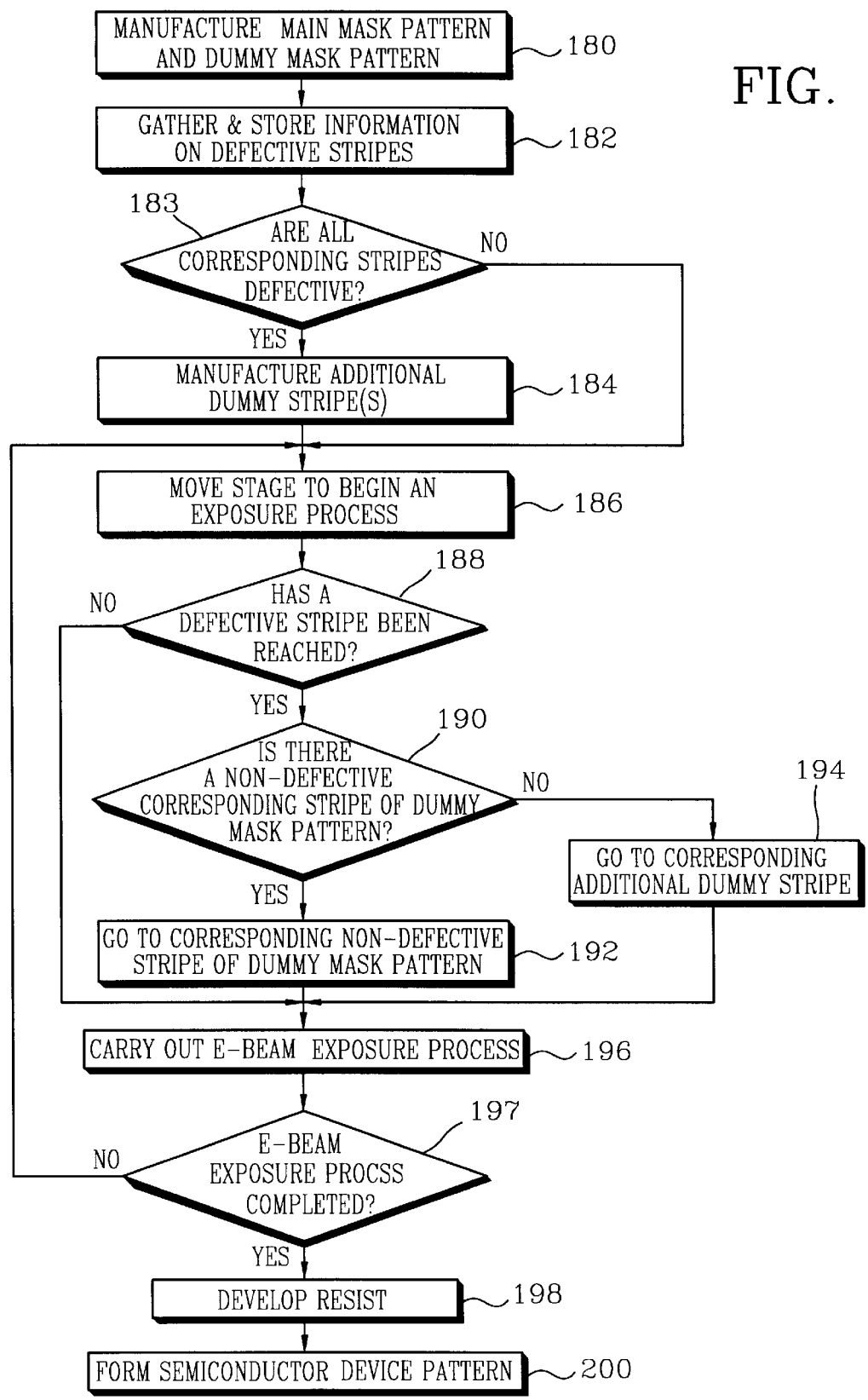
FIG. 8 is a flowchart of a third embodiment of a lithographic method of forming a semiconductor device pattern on a wafer according to the present invention, using the E-beam mask of FIG. 5.

Next, the forming of a semiconductor device pattern on a wafer using the E-beam mask of FIG. 5 will be described with reference to the flowchart of FIG. 8. In step 180, the main pattern 42 and dummy pattern 44 are produced on the membrane 40. Recall that the stripes 41 of the main pattern 42 include defective stripes 48a and 48c, and that the stripes 43 of the dummy pattern 44 include one defective stripe 48b. Thus, an inspection reveals (in step 183) that the defective stripe 48b of the dummy pattern 44 happens to correspond to the defective stripe 48c of the main pattern 42. Thus, in step 184, a dummy stripe 46 corresponding to the defective stripes 48c and 48b is formed where there is spare room on the membrane 40. The dummy strip 46 is formed in the same way as described in connection with step 156 shown in FIG. 7.

After the E-beam mask comprising the main pattern 42, the dummy pattern 44, and the dummy stripe 46 is manufactured, the E-beam exposure process starts (step 186) at the first row of stripes of the main pattern 42 in step 186. The fifth stripe 48a from the left in the first row of stripes of the main pattern 42 is confirmed as having defects before the E-beam exposure process using that stripe is carried out. Therefore, after the E-beam exposure process is carried out using the fourth stripe from the left in the first row, the next E-beam exposure process is carried out on the corresponding non-defective stripe in the first row of the dummy pattern 44 (steps 188 190, 192 and 196). The E-beam exposure processes using the first row of stripes are then completed in the dummy pattern 44. Respective ones of steps 186 through 197 are repeated wherein the E-beam exposure processes are carried out on the stripes in the second row of the dummy pattern 44 by moving the mask stage in the negative direction of the Y-axis. However, the fourth stripe 48b from the right in the second row of stripes of the dummy pattern 44 and the fourth stripe 48c from the right in the second row of stripes of the main pattern 42 both have defects. Thus, after the E-beam exposure process has been carried out using the third stripe from the right in the second row of stripes of the dummy pattern 44, the mask stage is moved such that the next E-beam exposure process is carried out on the corresponding dummy stripe 46 in steps 190, 194 and 196. Subsequently, the E-beam exposure process is carried out using the other stripes in the second, third, and fourth rows, whereupon the process are completed (step 197). In step 198, the resist exposed to the E-beam is developed and in step 200, a semiconductor device pattern is formed using the developed resist.

When the semiconductor device is manufactured using the E-beam masks of FIGS. 4 and 5, the E-beam exposure process can be carried out successfully (using the dummy stripes 36a, 36b, 36c, and 46) even though the stripes in the main pattern have defects, and even though a corresponding dummy stripe of the dummy pattern also has defects.

Figure 9:
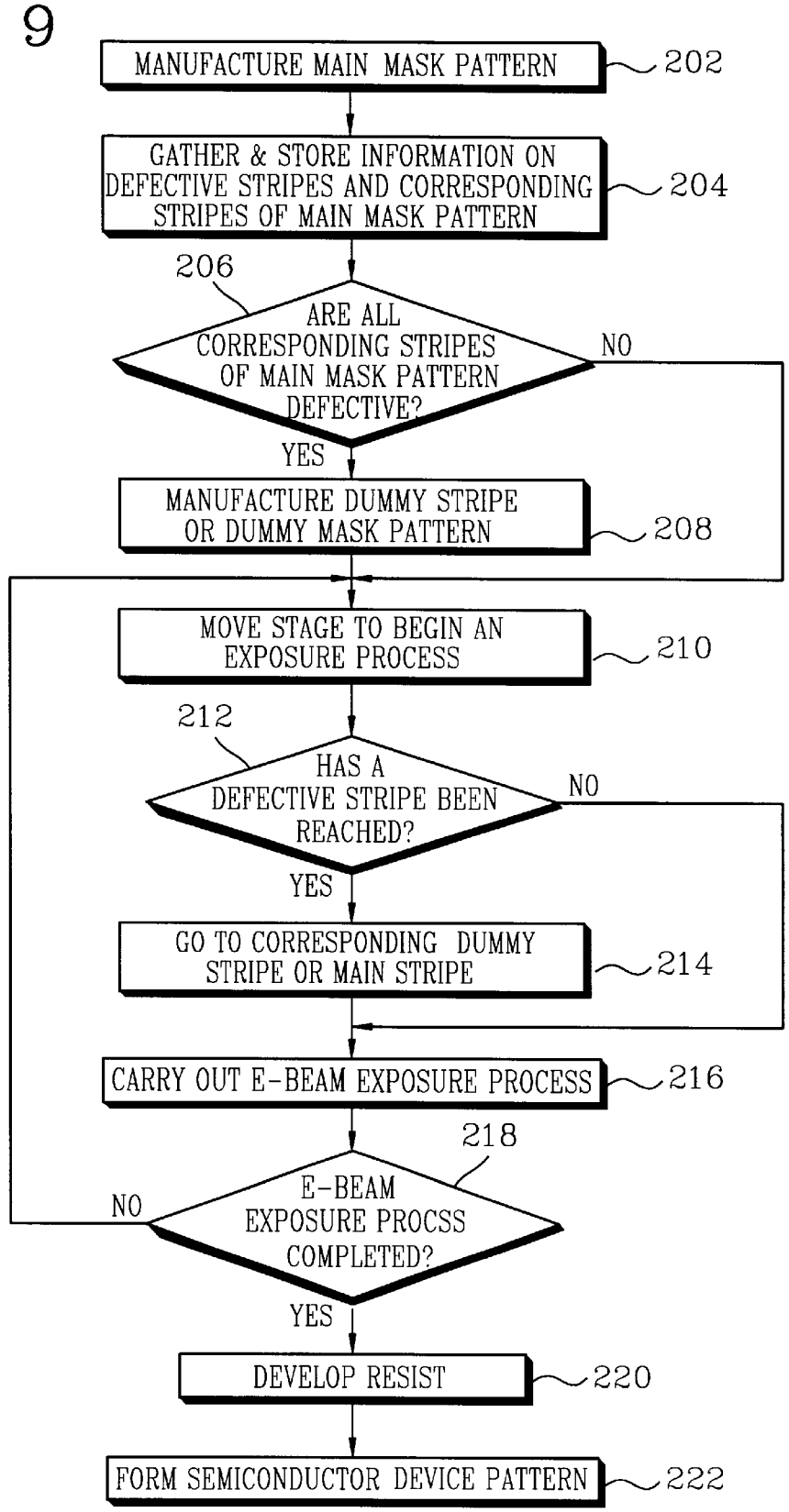
FIG. 9 is a flowchart of a lithographic method of forming a DRAM cell pattern according to the present invention.

FIG. 9 is a flowchart showing the steps of manufacturing a DRAM cell according to the present invention. The manufacturing of a DRAM requires the transferring of identical images to different areas across a substrate. A mask for manufacturing a DRAM cell, therefore, will have a main pattern in which at least some of the stripes have the same pattern. Accordingly, in the case in which the mask has non-defective stripes defining the same pattern as the defective stripes, it is not necessary to manufacture additional dummy stripes. That is, when the present invention is applied to the manufacturing of DRAM cells, there are times when the DRAM cells can be manufactured without producing dummy mask patterns or dummy stripes.

In step 202, a main pattern comprising a plurality of stripes is manufactured, and the mask is then inspected to determine whether it has defective stripes and whether there are any stripes having patterns defining the same images as the defective stripes (hereinafter "corresponding stripes") that are non-defective. The results of the inspection are stored in a memory device (step 204).

If all of the corresponding stripe(s) of the mask pattern are determined in step 206 to have a defect, a dummy stripe or stripes or a dummy pattern is manufactured in step 208 depending on the size and amount of spare room on the membrane of the mask. In step 210, an E-beam exposure process is begun. If the E-beam exposure process is ready to irradiate a defective stripe of the main pattern, as determined in step 212, the E-beam exposure process is carried out using a corresponding non-defective dummy stripe or a corresponding non-defective stripe of the main mask pattern instead. Steps 214, 218, 220 and 222 are essentially the same as steps 164, 166, 168, and 170 of FIG. 7 and thus, will not be described in further detail.

As is apparent from the present invention as described above, an image is never transferred to the resist from a defective stripe of the E-beam mask. Thus, the semiconductor devices manufactured using the mask are of high quality, i.e. the E-beam masks and lithographic methods using the same according to the present invention can be characterized as providing a high yield of semiconductor devices. In addition, the lithographic processes can be programmed to progress among the non-defective stripes of the particular mask in use in the shortest time possible.

Finally, although the present invention has been described above in connection with the preferred embodiments thereof, various changes thereto and modifications thereof will be readily apparent to those of ordinary skill in the art. Therefore, all such changes and modifications that fall within the scope of the appended claims are seen to be within the true spirit and scope of the invention.

What is claimed is:

1. An electron beam (E-beam) mask for use in a lithographic process for exposing selected areas of a resist to an electron beam (E-beam), said mask comprising:
    a membrane;
    a main pattern of a plurality of stripes covering said membrane; and
    at least one dummy stripe covering said membrane in spare room on said membrane outside a space bounded by said main pattern, each said at least one dummy stripe comprising a non-defective dummy stripe defining an image that corresponds to that of a defective stripe of the main pattern but without the defect of the defective stripe.

2. The E-beam mask of claim 1, wherein the total number of dummy stripes covering said membrane is an integral multiple of the total number of said stripes of the main pattern, wherein the membrane is covered with at least one dummy pattern having the same number of dummy stripes as the number of stripes of the main pattern.

3. The E-beam mask of claim 1, wherein the only dummy stripes covering said membrane are dummy stripes corresponding to the defective stripes of the main pattern.

4. The E-beam mask of claim 1, wherein the only dummy stripes covering said membrane comprise at least one dummy pattern each of which consists of the same number of dummy stripes as the number of stripes of the main pattern, and at least one said non-defective dummy stripe corresponding to a respective said defective stripe of the main pattern.

5. The E-beam mask of claim 1, wherein each of said stripes is 1 mm by 12 mm.

6. The E-beam mask of claim 2, wherein each of said stripes is 1 mm by 12 mm.

7. The E-beam mask of claim 3, wherein each of said stripes is 1 mm by 12 mm.

8. The E-beam mask of claim 4, wherein each of said stripes is 1 mm by 12 mm.

9. The E-beam mask of claim 1, wherein each of said stripes is 1 mm by 1 mm.

10. The E-beam mask of claim 2, wherein each of said stripes is 1 mm by 1 mm.

11. The E-beam mask of claim 3, wherein each of said stripes is 1 mm by 1 mm.

12. The E-beam mask of claim 4, wherein each of said stripes is 1 mm by 1 mm.

13. The E-beam mask of claim 1, wherein said material is selected from the group consisting of chrome and tungsten, and said membrane is of silicon nitride.

14. The E-beam mask of claim 2, wherein said material is selected from the group consisting of chrome and tungsten, and said membrane is of silicon nitride.

15. The E-beam mask of claim 3, wherein said material is selected from the group consisting of chrome and tungsten, and said membrane is of silicon nitride.

16. The E-beam mask of claim 4, wherein said material is selected from the group consisting of chrome and tungsten, and said membrane is of silicon nitride.

17. A lithographic method in the process of manufacturing a semiconductor device, comprising the steps of:
    manufacturing an E-beam mask by producing on a membrane a main pattern comprising a plurality of stripes and at least one dummy pattern comprising a plurality of dummy stripes, the number of stripes of said main pattern and the number of stripes of each said dummy pattern being equal, and the stripes of said main pattern and the stripes of each said dummy pattern corresponding to one another with respect to the patterns thereof;
    subsequently inspecting said mask to uncover defective ones of said stripes, and storing information indicative of which of said stripes have said defects; and
    directing the E-beam onto areas of a resist through respective ones of the stripes of the E-beam mask in a sequence wherein the E-beam is directed through the stripes one after another as long as said stripes do not have said defects, and wherein, based on said stored information, when a said defective stripe in one of the dummy and main patterns is reached during the course of said sequence, the E-beam is directed instead through a stripe outside of said one of the dummy and main patterns and which stripe has a said correspondence with said defective stripe but is itself free of a defect that would otherwise prevent the E-beam from properly transferring the image thereof to the resist.

18. The method of claim 17, wherein said manufacturing of the E-mask comprises producing a plurality of said dummy patterns.

19. The method of claim 17, wherein if said inspecting uncovers that each said dummy stripe corresponding to a defective one of the stripes of said main pattern is also a defective stripe, the method further comprises forming a respective additional dummy stripe corresponding to the defective corresponding stripes of the main and dummy patterns in spare room on the membrane outside the regions bounded by the main and dummy patterns, and wherein the sequence of directing the E-beam through the stripes of the mask comprises directing the E-Beam through the additional dummy stripe instead of through the defective corresponding stripes of the main and dummy patterns once said sequence has progressed to one of the defective corresponding stripes of the main and dummy patterns.

20. The method of claim 17, and further comprising subsequently developing the resist and forming a semiconductor device pattern using the developed resist.

21. The method of claim 17, wherein said manufacturing of the E-mask comprises producing said stripes in a size of 1 mm by 12 mm.

22. The method of claim 17, wherein said manufacturing of the E-mask comprises producing said stripes in a size of 1 mm by 1 mm.

23. A lithographic method in the process of manufacturing a semiconductor device, comprising the steps of:

produccing a main pattern comprising a plurality of stripes on a membrane;

subsequently inspecting said mask to uncover defective ones of said stripes, and storing information indicative of which of said stripes have said defects;

based on said stored information, subsequently producing a number of dummy stripes corresponding to the number of defective stripes of the main pattern on said membrane in spare room outside the region bounded by said main pattern, each said dummy stripe defining an image that corresponds to that of a respective said defective stripe of the main pattern but without the defect; and directing the E-beam onto areas of a resist through respective ones of the stripes of the E-beam mask in a sequence wherein the E-beam is directed through the stripes of said main pattern one after another as long as such stripes do not have said defects, and wherein, based on said stored information, when a said defective stripe in the main pattern is reached during the course of said sequence, the E-beam is directed instead through the corresponding one of said dummy stripes.

24. The method of claim 23, and further comprising subsequently developing the resist and forming a semiconductor device pattern using the developed resist.

25. The method of claim 23, wherein said stripes are produced in a size of 1 mm by 12 mm.

26. The method of claim 23, wherein said stripes are produced in a size of 1 mm by 1 mm.

27. A lithographic method in the process of manufacturing a semiconductor device, comprising the steps of:

manufacturing an E-beam mask by producing a main pattern comprising a plurality of stripes on a membrane, and at least some of the stripes having the same pattern;

subsequently inspecting said mask to uncover defective ones of said stripes, and storing information indicative of which of said stripes have the same pattern and which of said stripes have said defects;

based on said inspecting, producing a dummy stripe in spare room on said membrane outside the region bounded by said main pattern when all of said at least some of the stripes having the same pattern are said defective stripes, the material of the additional dummy stripe having the same pattern as said at least some of said stripes of the main pattern, and the additional dummy stripe not having any said defect, and subsequently, and based on said stored information, directing the E-beam onto areas of a resist through respective ones of the stripes of the E-beam mask in a sequence wherein the E-beam is directed through the stripes of said main pattern that do not have said defects, and wherein, based on said stored information, when a said defective stripe in the main pattern is reached during the course of said sequence, the E-beam is directed instead through another one of said stripes of the main pattern that has the same pattern as the defective stripe as long as said another one of the stripes is not a said defective stripe, but wherein, when all of the at least some of said stripes of the main pattern have defects, the E-beam is instead directed through said additional dummy stripe.

* * * * *